US012690160B2

(12) United States Patent
Pamidighantam et al.

(10) Patent No.: US 12,690,160 B2
(45) Date of Patent: Jul. 21, 2026

(54) HEXAGONAL HEATSINK SYSTEM

(71) Applicant: LightSpeed Photonics Pte Ltd,
Singapore (SG)

(72) Inventors: Venkata Ramana Pamidighantam,
Hyderabad (IN); Ubed Mohammed,
Hyderabad (IN); Rohin Kumar
Yeluripati, Secunderabad (IN)

(73) Assignee: LightSpeed Photonics Pte Ltd,
Singapore (SG)

( * ) Notice: Subject to any disclaimer, the term of this
patent is extended or adjusted under 35
U.S.C. 154(b) by 417 days.

(21) Appl. No.: 18/525,385

(22) Filed: Nov. 30, 2023

(65) Prior Publication Data

US 2024/0179869 A1     May 30, 2024

(30) Foreign Application Priority Data

Nov. 30, 2022     (SG) ............................ 10202260267V

(51) Int. Cl.
*H05K 7/20*          (2006.01)
(52) U.S. Cl.
CPC ....... *H05K 7/20209* (2013.01); *H05K 7/2039*
(2013.01)
(58) Field of Classification Search
CPC .................................................. H05K 7/20209

USPC .......................................................... 700/300
See application file for complete search history.

(56) References Cited

U.S. PATENT DOCUMENTS

| | | | | |
|---|---|---|---|---|
| 2009/0092262 | A1* | 4/2009 | Costa | G10K 11/16 |
| | | | | 381/71.1 |
| 2015/0138723 | A1* | 5/2015 | Shedd | F25B 41/00 |
| | | | | 165/104.29 |
| 2021/0356180 | A1* | 11/2021 | Miozza | F25B 21/02 |
| 2026/0025950 | A1* | 1/2026 | Schaap | H05K 7/20272 |

* cited by examiner

*Primary Examiner* — Travis R Hunnings
(74) *Attorney, Agent, or Firm* — Barta Jones, PLLC

(57) ABSTRACT

The hexagonal heatsink system introduces a novel approach
to efficient electronic device cooling. It includes heatsink
devices, each with an electronic circuit board and heatsink
elements for heat transfer, all attached via a hexagonal base
plate with fins for enhanced cooling. Temperature sensors
are placed near processors strategically to monitor tempera-
ture values. The system employs a feedback circuit that
collects sensor data, calculates an effective temperature, and
regulates a fan based on the comparison with a threshold
temperature. It can control additional fan parameters, such
as speed. This system offers an effective solution for main-
taining optimal operating temperatures in electronic devices,
particularly those with hexagonal base plates, improving
overall device reliability and preventing overheating even in
server racks.

10 Claims, 7 Drawing Sheets

Figure 1:
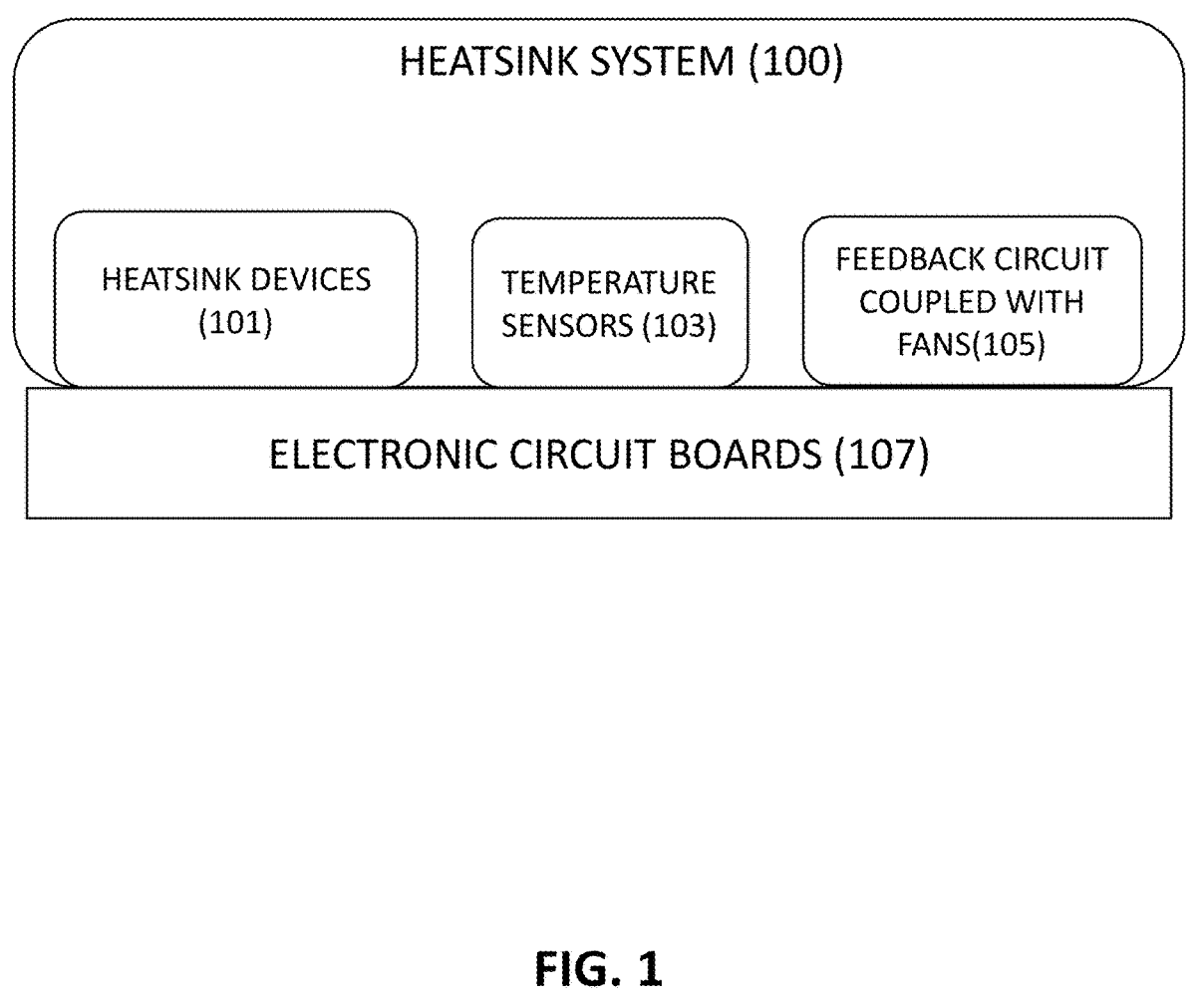

HEATSINK SYSTEM (100)

HEATSINK DEVICES
(101)

TEMPERATURE
SENSORS (103)

FEEDBACK CIRCUIT
COUPLED WITH
FANS(105)

ELECTRONIC CIRCUIT BOARDS (107)

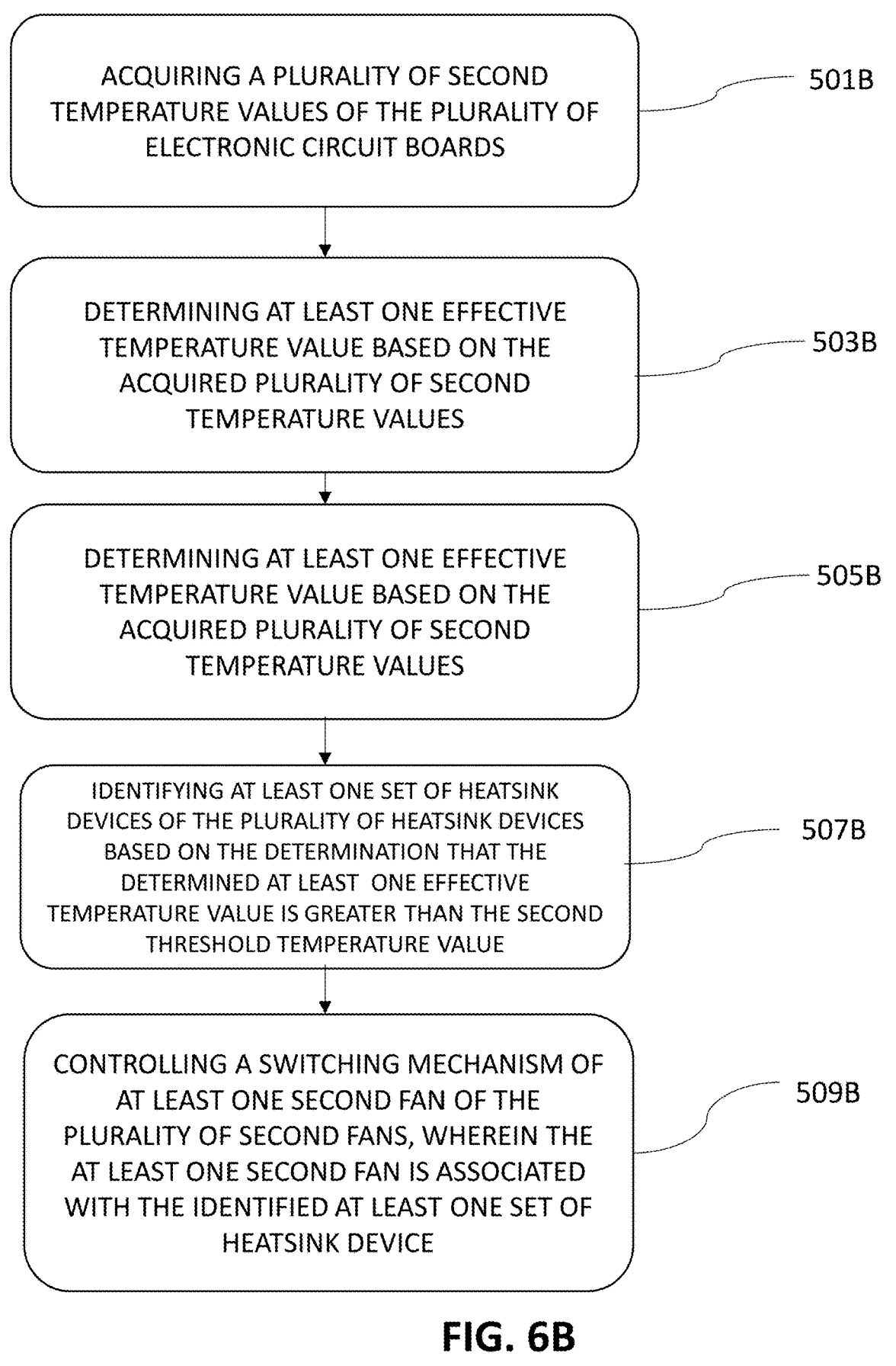

ACQUIRING A PLURALITY OF SECOND TEMPERATURE VALUES OF THE PLURALITY OF ELECTRONIC CIRCUIT BOARDS — 501B

DETERMINING AT LEAST ONE EFFECTIVE TEMPERATURE VALUE BASED ON THE ACQUIRED PLURALITY OF SECOND TEMPERATURE VALUES — 503B

DETERMINING AT LEAST ONE EFFECTIVE TEMPERATURE VALUE BASED ON THE ACQUIRED PLURALITY OF SECOND TEMPERATURE VALUES — 505B

IDENTIFYING AT LEAST ONE SET OF HEATSINK DEVICES OF THE PLURALITY OF HEATSINK DEVICES BASED ON THE DETERMINATION THAT THE DETERMINED AT LEAST ONE EFFECTIVE TEMPERATURE VALUE IS GREATER THAN THE SECOND THRESHOLD TEMPERATURE VALUE — 507B

CONTROLLING A SWITCHING MECHANISM OF AT LEAST ONE SECOND FAN OF THE PLURALITY OF SECOND FANS, WHEREIN THE AT LEAST ONE SECOND FAN IS ASSOCIATED WITH THE IDENTIFIED AT LEAST ONE SET OF HEATSINK DEVICE — 509B

FIG. 6B

HEXAGONAL HEATSINK SYSTEM

CROSS-REFERENCE TO RELATED APPLICATIONS

This application claims priority from Singapore Provisional Patent Application No. SG10202260267V, titled "HEXAGONAL HEATSINK" and filed on Nov. 30, 2022, which is incorporated herein by reference.

DESCRIPTION OF THE INVENTION

Technical Field of the Invention

The present invention relates to a system and method for enabling a heatsink. More specifically, the invention relates to methods and systems for enabling a dynamic, a hybrid hexagonal heatsink facilitating efficient active cooling and passive cooling in a compact environment of server rack.

BACKGROUND OF THE INVENTION

Heatsinks are crucial components in optoelectronic devices, designed to transfer heat away from processing components and maintain optimal operating temperatures. However, the existing heatsinks when there is rising power dissipations, as devices and circuit boards become more powerful and densely populated, the heat generated increases. This require heatsinks to effectively transfer heat away.

Designing effective heatsinks for high-performance computers and electronic devices involves navigating several critical considerations. Design constraints such as limited space, the choice between forced-convection and natural-convection cooling, and the presence of multiple heat-generating components can complicate heatsink design. Mechanical concerns, including heatsink weight, area/volume and attachment methods, must also account for shock and vibration requirements. Reliability is a paramount concern, as component temperature directly influences reliability, while the attachment method and thermal interface materials also play significant roles. Cost factors are multifaceted, varying with heatsink style, volume/area, and whether it's a standard or custom product. Material selection, typically aluminum or copper, can significantly affect heatsink performance. Furthermore, the choice of thermal interface materials, such as thermal adhesive or thermal paste, plays a pivotal role in enhancing the heat sink's performance by filling air gaps between the heat sink and the device's heat spreader. Ultimately, addressing these multifarious challenges is imperative to ensure the functionality and longevity of high-performance computers and electronic devices, as ineffective heatsinks can lead to damaging or even destroying vital components.

Existing heatsinks are limited in dimension and shape. For example, a heatsink that is square or rectangular in shape may transfer heat from a limited area restricted to their respective shapes and dimensions. Further, magnitude of heat transferred is also limited by dimension and shape. For example, amount of heat transferred (in Joules) in an area specified by a specific shape (i.e. square) on an electronic board is limited. Hence, there is a need to have a heatsink that may transfer higher magnitude of heat in a specific shape, area, cost effective and compact in nature.

OBJECT OF THE INVENTION

The principal object of the invention is to enable a hexagonal heatsink system.

Another object of the invention is to enable an active and passive cooling system and method for opto-electronic system in package and maintain optimum temperature inside a server rack.

Another object of the invention relates to methods and systems for enabling economical and compact heatsink.

These and other objects and characteristics of the present invention will become apparent from the further disclosure to be made in the detailed description given below.

SUMMARY OF THE INVENTION

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

The problem of limited heat transfer in regular of specific shape (i.e. square and rectangle) capable of only passive cooling is solved by a hexagonal heatsink system with both passive cooling and active cooling capabilities. The hexagonal heatsink system represents a novel approach to efficient heat dissipation in electronic devices. This system comprises a set of heatsink devices, each consisting of an electronic circuit board housing at least one processor, and a group of heatsink elements for effective heat transfer. These heatsink devices are attached to the electronic circuit board via a hexagonal base plate with plurality of first and plurality of second fins extending in perpendicular directions for enhanced cooling. Temperature sensors are strategically placed and associated with each heatsink device to monitor temperature values.

The critical component in this system is a feedback circuit, which plays a central role in heat management. It collects temperature data from the sensors and calculates an effective temperature value. This value is then compared to a predefined threshold temperature, and based on this comparison, the feedback circuit regulates the operation of a fan. The fan can be switched on or off as necessary to maintain the desired temperature levels. Moreover, the feedback circuit can control additional parameters associated with the fan, such as its speed, to optimize the cooling process further.

In the present invention this hexagonal heatsink system is a sophisticated cooling solution for electronic system in packages, particularly those with hexagonal shape. It ensures that the system operates at an optimal temperature level by continuously monitoring and adjusting the cooling process. This invention also enhances the efficiency and reliability of electronic devices, making them less susceptible to overheating and associated issues and work with optimum efficiency.

The heatsink system is composed of various heatsink devices interconnected with electronic circuit boards. Each circuit board is paired with a temperature sensor, while individual heatsink devices have corresponding first fans, and sets of these devices are linked to second fans. Operating within this system, a feedback circuit monitors temperatures: firstly, it detects circuit boards surpassing a predefined threshold, activating specific first fans linked to the overheating heatsink devices for targeted cooling. Secondly, it assesses overall heat by computing an effective temperature based on collected sensor data and determines if it exceeds a second threshold, identifying sets of heatsink devices that require additional cooling and controlling the corresponding second fans accordingly. This systematic approach ensures precise and efficient management of cooling mechanisms in response to varying heat levels within the system's components.

To the accomplishment of the foregoing and related ends, the one or more aspects comprise the features hereinafter fully described and particularly pointed out in the claims. The following description and the drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF DRAWINGS

The foregoing and other features of embodiments will become more apparent from the following detailed description of embodiments when read in conjunction with the accompanying drawings. In the drawings, like reference numerals refer to like elements.

In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention. Throughout the disclosure the system and the foot tracing system may interchangeably be used.

FIG. 1 illustrates block diagram of components associated with enabling a hexagonal heatsink system, according to one embodiment of the invention.

FIGS. 6A-6B illustrates a flowchart for enabling hexagonal heatsink system, according to one embodiment of the invention.

DETAILED DESCRIPTION OF THE INVENTION

Figure 2:
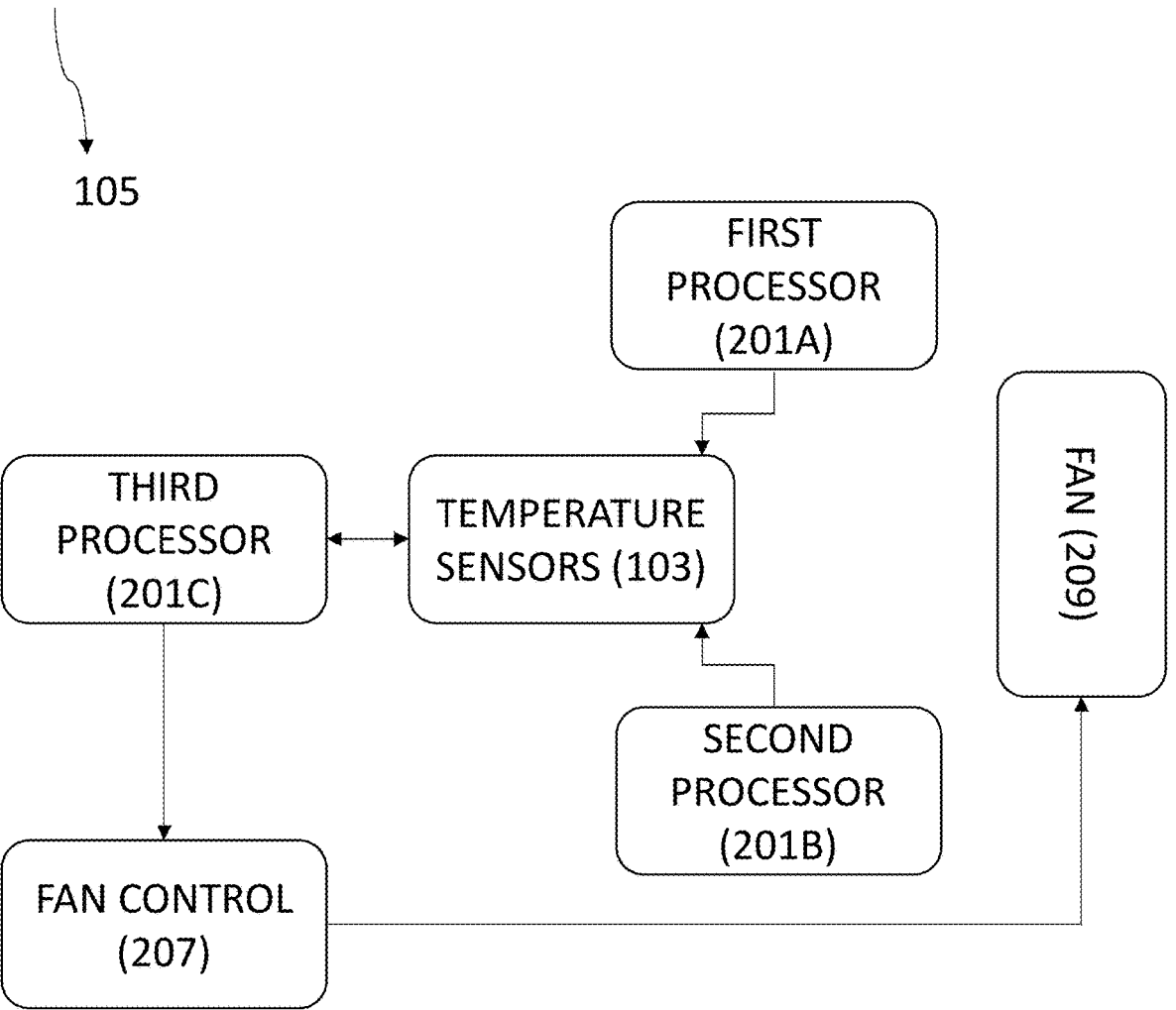
FIG. 2 illustrates an environment for enabling a temperature sensitive feedback circuit associated with the hexagonal heatsink system, according to one embodiment of the invention.

Reference will now be made in detail to the description of the present subject matter, one or more examples of which are shown in figures. Each example is provided to explain the subject matter and not a limitation. Various changes and modifications obvious to one skilled in the art to which the invention pertains are deemed to be within the spirit, scope and contemplation of the invention.

As used in the application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i)

to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The word "exemplary" is used herein to mean "serving as an example, instance, or illustration." Any aspect described herein as "exemplary" is not necessarily to be construed as preferred or advantageous over other aspects.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

FIG. 1 illustrates block diagram of components associated with enabling a hexagonal heatsink system, according to one embodiment of the invention. In some example embodiments, the hexagonal heatsink system (100) comprises a heatsink device (101), a plurality temperature sensor (103) and a feedback circuit coupled with fans (105). In some example embodiments the hexagonal heatsink system (100) is placed above the electronic circuit board (107). In some example embodiments the hexagonal heatsink system (100) configured to extract heat generated and cool off the electronic circuit board (107).

FIG. 2 illustrates an environment for enabling a temperature sensitive feedback circuit associated with the hexagonal heatsink system, according to one embodiment of the invention. In some example embodiments the network environment for feedback circuit (103) associated with a hexagonal heatsink system (100) comprises a plurality of processors (201), a plurality of temperature sensors (203), a fan control (207) and a fan (209). In some example embodiments the plurality of processor may be but not limited to FPGAs. In some example embodiments a first processor (201A) and a second processor (201B) may be placed on the electronic circuit board (105). A temperature sensor (203) is placed near the first processor (201A) and the second processor (201B) individually. In some example embodiments the temperature sensors (203) give the temperature data and over temperature alert details to a third processor (201C). In some example embodiments the third processor (201C) may be but not limited to MAX 10. In some example embodiments the third processor (207) controls the fan (209) based on the temperature data obtained from temperature sensors (203). In some example embodiments the third processor (201C) the MAX 1619 is an 8-bit serial ADC with built in temperature sensor, this also communicates with a plurality of microcontrollers via SMbus and measure the temperatures from local and remote diodes (temperature sensors (203)). Additionally, third processor (201C) also provides temperature data, supports alarms and has noise rejection. This third processor will specifically give and analyze the temperatures of plurality of processors (201).

In accordance with an embodiment, the processor may be of any type of processor, such as 32-bit processors using a flat address space, such as a Hitachi SH1, an Intel 80386, an Intel 960, a Motorola 68020 (or other processors having similar or greater addressing space). Processor types other than these, as well as processors that may be developed in the future, are also suitable. The processor may include general processor, Digital Signal Processing (DSP) chip, an Application Specific Integrated Circuit (ASIC), Field Programmable Gate Arrays (FPGAs), AT89S52 microcontroller firmware or a combination thereof.

Processors suitable for the execution of a computer program include, by way of example, both general and special purpose microprocessors, and anyone or more processors of any kind of digital computer. Generally, a processor receives instructions and data from a read only memory or a random-access memory or both. The essential elements of a computer are a processor for performing instructions and one or more memory devices for storing instructions and data. Generally, a computer also includes, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a GPS receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The memory may be a non-transitory medium such as a ROM, RAM, flash memory, etc. The processor and the memory can be supplemented by, or incorporated in, special purpose logic circuitry.

The processes and logic flows described in the specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). In accordance with an embodiment, there may exist a memory includes both dynamic memory (e.g., RAM, magnetic disk, writable optical disk, etc.) and static memory (e.g., ROM, CD-ROM, etc.).

The processor may be connected to a network. In accordance with an embodiment, network includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (Wi-Fi), wireless LAN (WLAN), Bluetooth®, Internet Protocol (IP) data casting, ZigBee satellite, mobile ad-hoc network (MANET), and the like, or any combination thereof.

Although the present specification describes components and functions that may be implemented in particular embodiments with reference to particular standards and protocols, the invention is not limited to such standards and protocols. For example, The ZigBee or ZigBee/IEEE 802.15.4 protocol is a specification created for wireless networking. It includes hardware and software standard design for WSN (Wireless sensor network) requiring high reliability, low cost, low power, scalability and low data rate. Accordingly, replacement standards and protocols having the same or similar functions as those disclosed herein are considered equivalents thereof.

In an example embodiment, there may exist a communication interface may include but not limited to traditional interfaces which include no intelligence in the interface, only physical connection which could include changes in voltage levels and transformation from balanced to unbalanced signal, communication protocols which may use preprogrammed modules etc. Further, the communication interface may include Modern interfaces, which have a high level of intelligence in the interface where a high level of intelligence in the interface is employed to execute operations.

Figure 3:
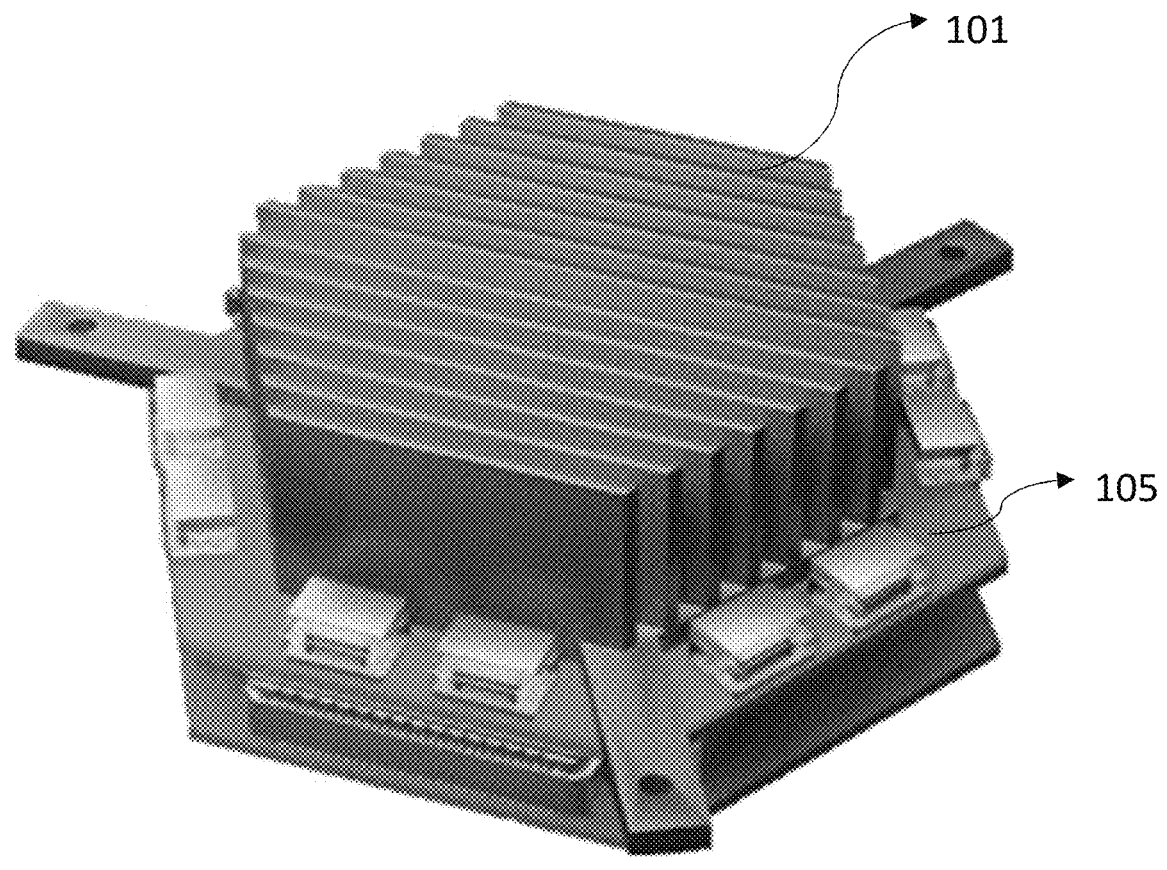
FIG. 3 illustrates a functional electronic circuit board with a hexagonal heatsink device, according to one embodiment of the invention.

FIG. 3 illustrates a functional electronic circuit board with a hexagonal heatsink device, according to one embodiment of the invention. In some example embodiments the hexagonal heatsink system (100) comprises an electronic circuit board (105) and a hexagonal heatsink device (101). In some example embodiments the heatsink devices (101) placed on the surface of electronic circuit board (105) to extract the heat generated by computational processes taking place within electronic circuit board (105). In some example embodiments the heatsink devices (101) placed on the surface of electronic circuit board (105) using Thermal Interface Material may be TPCM 7000 series which has a maximum thermal. In some example embodiments the heatsink devices (101) may be made up of Copper material used because of their higher thermal conductivity.

Figure 4A:
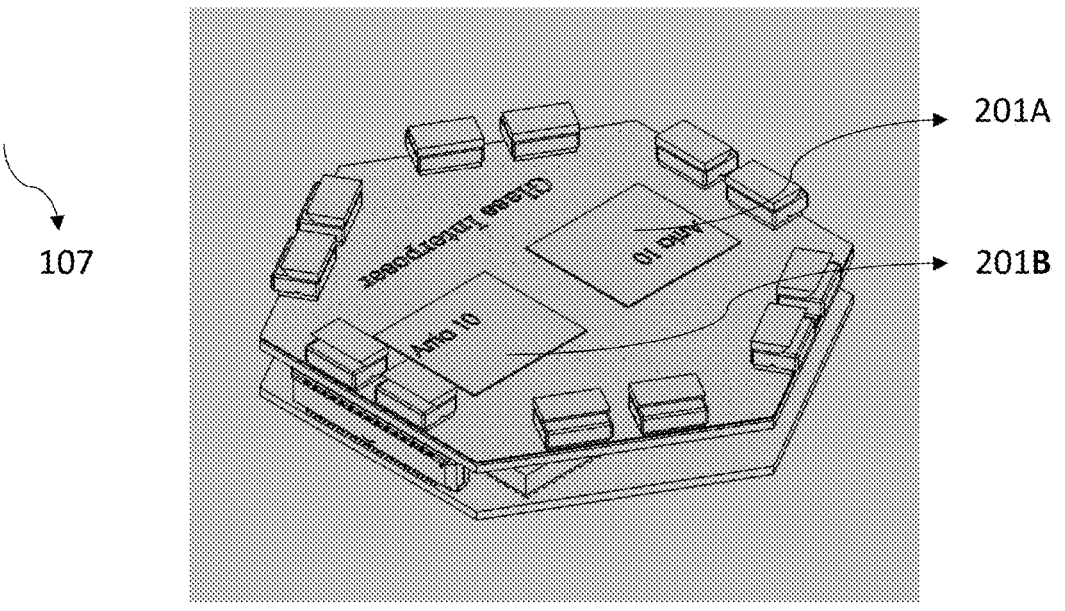
FIG. 4A illustrates the functional electronic circuit board, according to one embodiment of the invention.

FIG. 4A illustrates the structure of an electronic circuit board, according to one embodiment of the invention. In some example embodiments, the electronic circuit board (105) comprises a plurality of processors (201) and some additional components but not limited to microcontrollers, ICs, etc. In some example embodiments the plurality of the processors may include a first processor (201A) and a second processor (201B). In some example embodiments the first processor (201A) and the second processor (201B) may be but not limited to intel Arria 10 FPGA.

Figure 4B:
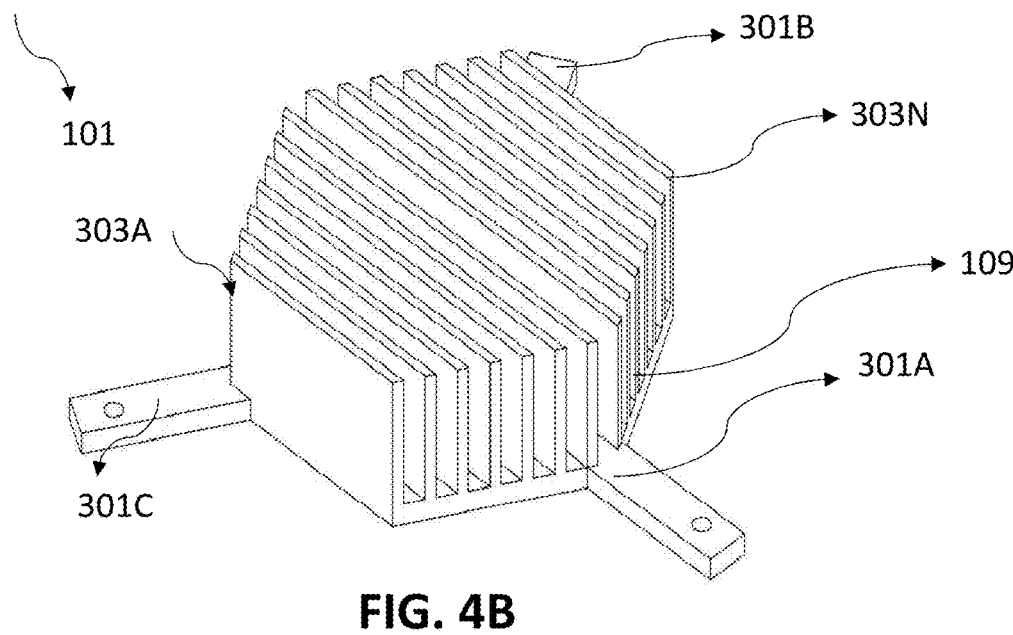
FIG. 4B illustrates the structure of the hexagonal heatsink device, according to one embodiment of the invention.

FIG. 4B illustrates the structure of hexagonal heatsink device, according to one embodiment of the invention. In some example embodiments the hexagonal heatsink system (100) comprises plurality of heatsink devices (101). The plurality of heatsink devices (101) include a hexagonal baseplate (109), a plurality of first fins (301), a plurality of second fins (303). In some example embodiments the plurality of first fins (301) comprises a first fin (301A) of plurality of first fins, a second fin (301B) of plurality of first fins and a third fin (301C) of plurality of first fins. In some example embodiments the plurality of first fins (301) attached to either odd or even vertices of the hexagonal shaped base plate (109) in first direction. In some example embodiments the plurality of first fins (301) includes a slot to attach the plurality of heatsink devices (101) to the electronic circuit board (105). In some example embodiments the plurality of heatsink devices (101) comprises a plurality of second fins (303) that extends from the base plate in second direction. In some example embodiments the plurality of first fins (301) and the plurality of second fins (303) attached to base plate (109) in first and second direction are perpendicular to each other. In some example embodiments the shape of the plurality of second fins (303) may be but not limited to trapezoidal shape. In some example embodiments the plurality of second fins (303) may include a first fin (303A) of plurality of second fins and so on until an nth fin (303N) of plurality of second fins. In some example embodiments, the method used for the plurality of heatsink (101) manufacturing is milling. In some example embodiments, the plurality of heatsink device (101) may be a single mould which includes the base and fins all together. The hexagonal heatsink device (101) is mounted on the electronic circuit board (105) using a mounting slot which provides resistance to the stresses and deformations acting on the electronic circuit board (105).

In some example embodiments, each heatsink device (101) of the plurality of heatsink devices (101) includes a base plate (109), a plurality of first fins (301) that extend from the base plate (109) in a first direction, and a plurality of second fins (303) that extend from the base plate (109) in a second direction perpendicular to the first direction, a shape of the base plate (109) is a hexagonal shape, and the plurality of heatsink devices (101) is attached to the plurality of electronic circuit boards (107) via the plurality of first fins (301).

In an example embodiment, consider a heatsink device (101) that is of rectangular shape having a certain volume. Such rectangular heatsink device (101) may absorb 'X' joules of heat. Next consider a hexagonal heatsink having the same volume as the rectangular heatsink, absorbs 'X1' joules of heat, wherein magnitude of X1 is greater than X. In an example embodiment the trapezoidal shaped plurality of second fins (303) having area of the 7 fins in in one half of the base plate (109) as 658.1, 748.19, 838.15, 928.24, 1018.33, 1108.42, 1198.51 square mm. In some example embodiments. If the plurality of second fins (303) has rectangular fins then the area of them is calculated as 639.42, 729.64, 819.6, 909.56, 999.78, 1089.74, 1179.96 square mm. Based on the calculations the trapezoidal shaped fins cover 18 square mm more area than rectangular shaped fin.

In some example embodiments the increased surface area of trapezoidal shaped plurality of second fins (303) helps for heat to travel more area hence the better heat dissipation. Such advancement in heat absorption is enabled by the hexagonal shape of the heatsink devices (101). In some example embodiments, use of non-regular shape provides more edge surface for improved input output connections. In some example embodiments the surface area of the base-plate may be 1455.62 square mm on which plurality of second fins are placed vertically in such a way that the distance between two second plurality of fins should be at least twice the thickness of one fin.

In some example embodiments, with respect heatsink device (101) the thermal conductivity of the material falls within the range of 315 W/m-K to 385 W/m-K. Heat dissipation hovers around 80 Watts, while the thermal resistance spans from 0.5625° C./W to 0.6875° C./W within the permissible range. The surface area (i.e. base plate) and fin design (first plurality of fins and second plurality of fins) ratio maintain a factor of 4.17, offering optimal heat dissipation. Additionally, the airflow and air velocity fluctuate between 16.74 cfm to 20.46 cfm and 0.279 in-H2O to 0.341 in-H2O respectively, translating to 3.15 m/s to 3.85 m/s, maintaining efficient cooling potential.

Figure 5:
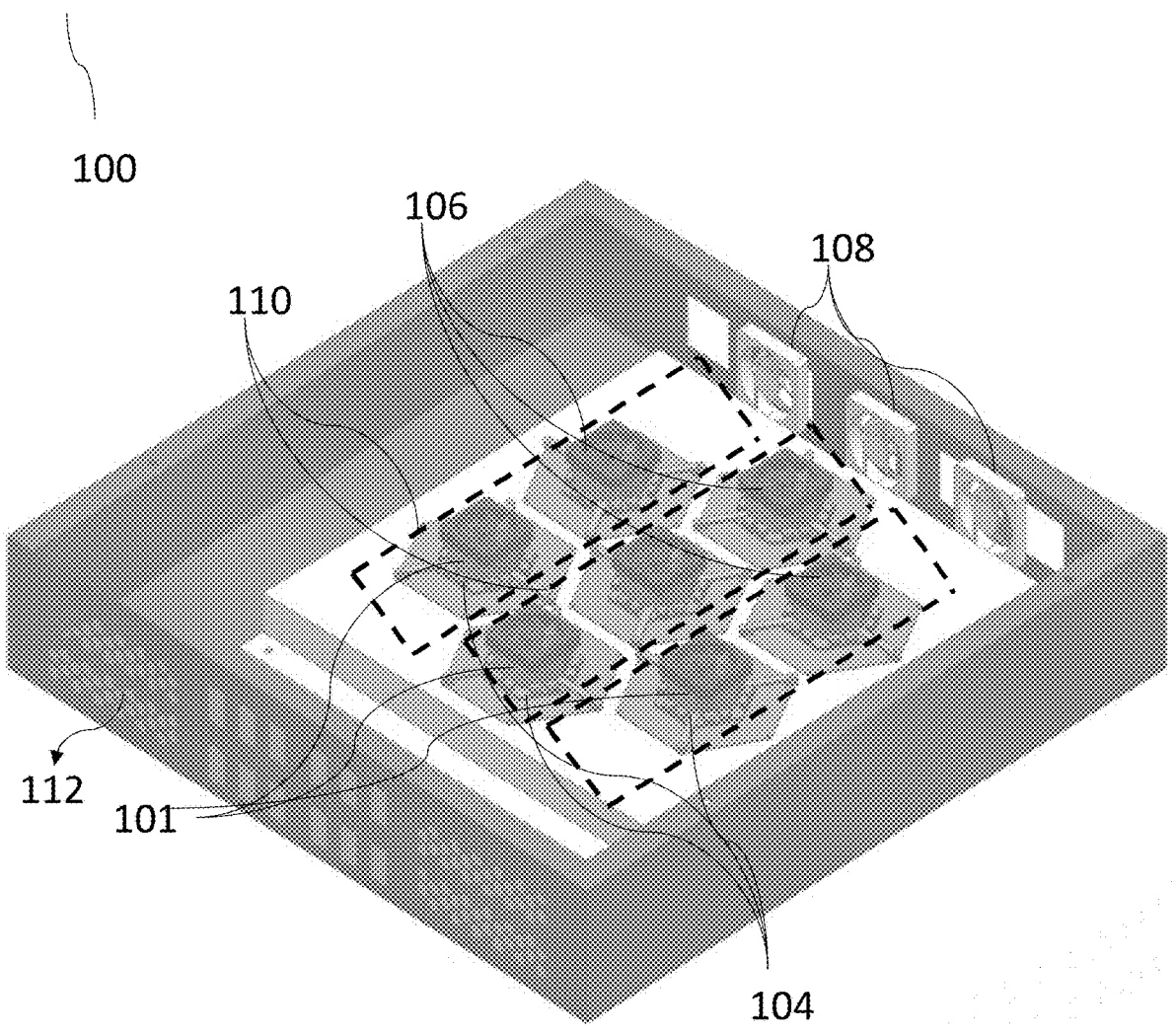
FIG. 5 illustrates an exemplary scenario of plurality of heatsink systems within a server rack, according to one embodiment of the invention.

FIG. 5 illustrates an example scenario of plurality of heatsink systems within a server rack, according to one embodiment of the invention. A heatsink system (100) may be part of a sever rack, which comprises a plurality of heatsink devices (101), wherein the plurality of heatsink devices (101) is coupled to a plurality of electronic circuit boards (107). Each of these electronic circuit boards may be configured to perform a specific task. Further, the heat sink system (100) may comprise a plurality of temperature sensors (103), wherein each temperature sensor of the plurality of temperature sensors (103) is associated with a respective electronic circuit board (107) of the plurality of electronic circuit board (107). Further, the heat sink system (100) may comprise a plurality of first fans (106), wherein each first fan (106) of the plurality of first fans (106) is associated with a respective heatsink device (101) of the plurality of heatsink devices (101). Further, the heat sink system (100) may comprise a plurality of second fans (108), wherein each second fan (108) of the plurality of second fans (108) is associated with a respective set of heatsink devices (110) of the plurality of heatsink devices (101) and a feedback circuit (105) configured to acquire, from the plurality of temperature sensors (103), a plurality of first temperature values of the plurality of electronic circuit boards (107), followed by determination, from the acquired plurality of first temperature values, at least one first temperature value that is greater than a first threshold temperature value. Further, identification, based on the determined at least one first temperature value, at least one heatsink device (101) of the plurality of heatsink devices (101). Further, feedback circuit is configured to control a switching mechanism of at least one first fan (106) of the plurality of first fans (104), wherein the at least one first fan (106) is associated with the identified at least one heatsink device (101). The feedback circuitry (105) is also configured to acquire, from the plurality of temperature sensors (103), a plurality of second temperature values of the plurality of electronic circuit boards.

The feedback circuit (105) is further configured to determine at least one effective temperature value based on the acquired plurality of second temperature values and determine whether the determined at least one effective temperature value is greater than a second threshold temperature value. Further, the feedback circuitry (105) is configured to identify at least one set of heatsink devices (110) of the plurality of heatsink devices (101) based on the determination that the determined at least one effective temperature value is greater than the second threshold temperature value and control a switching mechanism of at least one second fan (108) of the plurality of second fans (108), wherein the at least one second fan (108) is associated with the identified at least one set of heatsink devices (110). The at least one second fan (108) of the plurality of second fans (108) enables air-flow for cool air through the plurality of heatsink devices (101) and the respective electronic circuit board (107) thereby influencing of on direct reduction of the temperature. Hot air thus formed is channeled via plurality of openings (112).

In some example embodiments, the switching mechanism of the at least one first fan (106) is controlled to switch-on the at least one first fan (106) of the plurality of first fans (106), and the switching mechanism of the at least one second fan (108) is controlled to switch-on the at least one second fan (108) of the plurality of second fans (108).

In some example embodiments, the feedback circuit is further configured to acquire, from the plurality of temperature sensors (103), a plurality of third temperature values of the plurality of electronic circuit boards (107) and control, based on the acquired third temperature values, the switching mechanism of the at least one first fan (106) to switch-off the at least one first fan (106). In some example embodiments, the feedback circuit (105) is further configured to acquire, from the plurality of temperature sensors (103), a plurality of fourth temperature values of the plurality of electronic circuit boards (107) and control, based on the acquired fourth temperature values, the switching mechanism of the at least one second fan (108) to switch-off the at least one second fan (108). The feedback circuit (105) is further configured to control a speed associated with each of the at least one first fan (106) and the at least one second fan (108).

In some example embodiments, the feedback circuit (105) is further configured to determine an average temperature value for each set of second temperature values of the plurality of second temperature values and determine the determined average temperature value as the at least one effective temperature value. In some example embodiments, the feedback circuit (105) is further configured to determine a highest second temperature value for each set of second temperature values of the plurality of second temperature values and determine the determined highest second temperature value as the at least one effective temperature value.

Figure 6A:
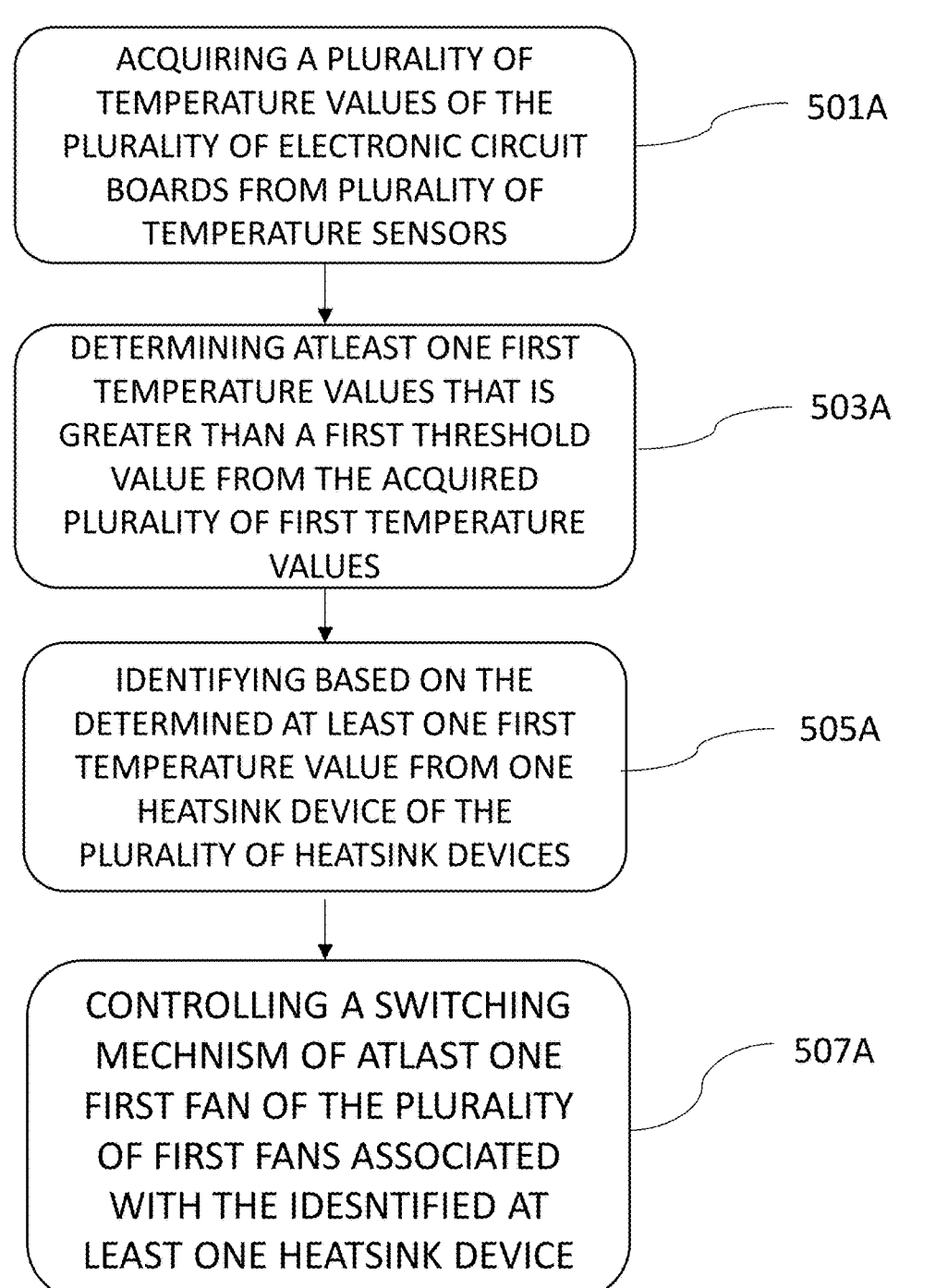

FIG. 6A illustrates a flowchart for enabling active cooling mechanism in the hexagonal heatsink system, according to one embodiment of the invention. In a heatsink system (100) including a plurality of heatsink devices (101), wherein the plurality of heatsink devices (101) is coupled to a plurality of electronic circuit boards (107), a plurality of temperature sensors (103), wherein each temperature sensor (103) of the plurality of temperature sensors (103) is associated with a respective electronic circuit board (107) of the plurality of electronic circuit board (107). Further, a plurality of first fans (106), wherein each first fan (106) of the plurality of first fans (106) is associated with a respective heatsink device (101) of the plurality of heatsink devices (101). A plurality of second fans (108), wherein each second fan (108) of the plurality of second fans (108) is associated with a respective set of heatsink devices (101) of the plurality of heatsink devices (101) and a feedback circuit (105).

In some example embodiments, at the step 501A the feedback circuitry (105) is acquiring, from the plurality of temperature sensors (103), a plurality of first temperature values of the plurality of electronic circuit boards (105).

In some example embodiments, at the step 503A the feedback circuitry (105) is determining, from the acquired plurality of first temperature values, at least one first temperature value that is greater than a first threshold temperature value.

In some example embodiments, at the step 505A the feedback circuitry (105) is identifying, based on the determined at least one first temperature value, at least one heatsink device (101) of the plurality of heatsink devices (101).

In some example embodiments, at the step 507A the feedback circuitry (105) is controlling a switching mechanism of at least one first fan (106) of the plurality of first fans (106), wherein the at least one first fan (106) is associated with the identified at least one heatsink device (101).

FIG. 6B illustrates a flowchart for enabling active cooling mechanism in a set-up of a series of the hexagonal heatsink systems, forming at least one set of heatsink devices (101) according to one embodiment of the invention.

In some example embodiments, at the step 501B the feedback circuitry (105) is acquiring, from the plurality of temperature sensors (103), a plurality of second temperature values of the plurality of electronic circuit boards (107).

In some example embodiments, at the step 503B the feedback circuitry (105) is determining, at least one effective temperature value based on the acquired plurality of second temperature values.

In some example embodiments, at the step 505B the feedback circuitry (105) is determining whether the determined at least one effective temperature value is greater than a second threshold temperature value.

In some example embodiments, at the step 507B the feedback circuitry (105) is identifying at least one set of heatsink devices (101) of the plurality of heatsink devices (101) based on the determination that the determined at least one effective temperature value is greater than the second threshold temperature value.

In some example embodiments, at the step 509B the feedback circuitry (105) is controlling a switching mechanism of at least one second fan (108) of the plurality of second fans (108), wherein the at least one second fan (108) is associated with the identified at least one set of heatsink devices (101).

In some example embodiments, at least one set of heatsink devices (110) may have three rows where each rows may have at least one heat sink devices (101) associated with respective electronic circuit board (107). More specifically, the first row has two heat sink devices (101), the second row has three heat sink devices (101), and the third row has two heat sink devices (101). Consider, the server is utilizing one processor of one of the electronic circuit board (107) present in the first row. In that case, the heatsink device (101) of that particular electronic circuit board (107) dissipates the heat passively. Even after that, once the temperate of the electronic circuit board (107) goes beyond a certain temperate the feedback circuitry (105) controls a fan (106) associated with that heat sink device (101) is activated for active cooling. Similar, process is observed in each of the rows and associated with heat sink devices (101) associated with respective rows and respective fans (106).

Further, in some other example embodiment, when the feedback circuitry (105) determines that when all the electronic circuit board (107) of one row, or one of the electronic circuit board (105) of one row increases beyond an effective temperature determined using respective temperature sensors (103), a fan parallel to respective row, of the plurality of second fans (108) is activated. Further, when the temperature of respective row comes below a temperature, a fan parallel to respective row, of the plurality of second fans (108) is deactivated. Similarly, when temperature of the electronic circuit board (107) is reduced below a temperature the fan present on the heat sink device (101) is deactivated. Throughout the disclosure, activate and deactivate may indicate switch-on and switch-off respectively. This control mechanism helps maintain the entire server rack (401) within a desired thermal range, optimizing both cooling efficiency and energy consumption. In this case, it may be observed that selected switching-on and switching off of respective fans enables significant reduction in power saving. Also, selective activating and deactivating of the plurality of second fans (108) enables targeted cooling of the sever. The at least one second fan (108) of the plurality of second fans (108) enables air-flow for cool air through the plurality of heatsink devices (101) and the respective electronic circuit board (107) thereby influencing of on direct reduction of the temperature. Hot air thus formed is channeled via plurality of openings (112).

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

We claim:

1. A heatsink system (100), comprising:
a plurality of heatsink devices (101), wherein the plurality of heatsink devices (101) is coupled to a plurality of electronic circuit boards (107);
a plurality of temperature sensors (103), wherein each temperature sensor of the plurality of temperature sensors (103) is associated with a respective electronic circuit board (107) of the plurality of electronic circuit board (107);
a plurality of first fans (106), wherein each first fan (106) of the plurality of first fans (106) is associated with a respective heatsink device (101) of the plurality of heatsink devices (101);
a plurality of second fans (108), wherein each second fan (108) of the plurality of second fans (108) is associated with a respective set of heatsink devices (110) of the plurality of heatsink devices (101); and
a feedback circuit (105) configured to:
acquire, from the plurality of temperature sensors (103), a plurality of first temperature values of the plurality of electronic circuit boards (107);
determine, from the acquired plurality of first temperature values, at least one first temperature value that is greater than a first threshold temperature value;
identify, based on the determined at least one first temperature value, at least one heatsink device (101) of the plurality of heatsink devices (101);
control a switching mechanism of at least one first fan (106) of the plurality of first fans (104), wherein the at least one first fan (106) is associated with the identified at least one heatsink device (101);
acquire, from the plurality of temperature sensors, a plurality of second temperature values of the plurality of electronic circuit boards;

determine at least one effective temperature value based on the acquired plurality of second temperature values;
determine whether the determined at least one effective temperature value is greater than a second threshold temperature value;
identify at least one set of heatsink devices (110) of the plurality of heatsink devices (101) based on the determination that the determined at least one effective temperature value is greater than the second threshold temperature value; and
control a switching mechanism of at least one second fan (108) of the plurality of second fans (108), wherein the at least one second fan (108) is associated with the identified at least one set of heatsink devices (110).

2. The heatsink system (100) as claimed in claim 1, wherein
the switching mechanism of the at least one first fan (106) is controlled to switch-on the at least one first fan (106) of the plurality of first fans (106), and
the switching mechanism of the at least one second fan (108) is controlled to switch-on the at least one second fan (108) of the plurality of second fans (108).

3. The heatsink system (100) as claimed in claim 2, wherein the feedback circuit is further configured to:
acquire, from the plurality of temperature sensors (103), a plurality of third temperature values of the plurality of electronic circuit boards (107); and
control, based on the acquired third temperature values, the switching mechanism of the at least one first fan (106) to switch-off the at least one first fan (106).

4. The heatsink system (100) as claimed in claim 2, wherein the feedback circuit (105) is further configured to:
acquire, from the plurality of temperature sensors (103), a plurality of fourth temperature values of the plurality of electronic circuit boards (107); and
control, based on the acquired fourth temperature values, the switching mechanism of the at least one second fan (108) to switch-off the at least one second fan (108).

5. The heatsink system (100) as claimed in claim 1, wherein the feedback circuit (105) is further configured to control a speed associated with each of the at least one first fan (106) and the at least one second fan (108).

6. The heatsink system (100) as claimed in claim 1, wherein the feedback circuit (105) is further configured to:
determine an average temperature value for each set of second temperature values of the plurality of second temperature values; and
determine the determined average temperature value as the at least one effective temperature value.

7. The heatsink system (100) as claimed in claim 1, wherein the feedback circuit (105) is further configured to:
determine a highest second temperature value for each set of second temperature values of the plurality of second temperature values; and
determine the determined highest second temperature value as the at least one effective temperature value.

8. The heatsink system (100) as claimed in claim 1, wherein
each heatsink device (101) of the plurality of heatsink devices (101) includes:
a base plate (109),
a plurality of first fins (301) that extend from the base plate (109) in a first direction, and a plurality of second fins (303) that extend from the base plate (109) in a second direction perpendicular to the first direction, a shape of the base plate (109) is a hexagonal shape, and the plurality of heatsink devices (101) is attached to the plurality of electronic circuit boards (107) via the plurality of first fins (301).

9. A method, comprising:

in a heatsink system (100) including a plurality of heatsink devices (101), wherein the plurality of heatsink devices (101) is coupled to a plurality of electronic circuit boards (107); a plurality of temperature sensors (103), wherein each temperature sensor (103) of the plurality of temperature sensors (103) is associated with a respective electronic circuit board (107) of the plurality of electronic circuit board (107); a plurality of first fans (106), wherein each first fan (106) of the plurality of first fans (106) is associated with a respective heatsink device (101) of the plurality of heatsink devices (101); a plurality of second fans (108), wherein each second fan (108) of the plurality of second fans (108) is associated with a respective set of heatsink devices (101) of the plurality of heatsink devices (101); and a feedback circuit (105):

acquiring, from the plurality of temperature sensors (103), a plurality of first temperature values of the plurality of electronic circuit boards (105);

determining, from the acquired plurality of first temperature values, at least one first temperature value that is greater than a first threshold temperature value;

identifying, based on the determined at least one first temperature value, at least one heatsink device (101) of the plurality of heatsink devices (101);

controlling a switching mechanism of at least one first fan (106) of the plurality of first fans (106), wherein the at least one first fan (106) is associated with the identified at least one heatsink device (101);

acquiring, from the plurality of temperature sensors (103), a plurality of second temperature values of the plurality of electronic circuit boards (107);

determining at least one effective temperature value based on the acquired plurality of second temperature values;

determining whether the determined at least one effective temperature value is greater than a second threshold temperature value;

identifying at least one set of heatsink devices (110) of the plurality of heatsink devices (101) based on the determination that the determined at least one effective temperature value is greater than the second threshold temperature value; and controlling a switching mechanism of at least one second fan (108) of the plurality of second fans (108), wherein the at least one second fan (108) is associated with the identified at least one set of heatsink devices (110).

10. A non-transitory computer readable medium having stored thereon, computer executable instructions, which when executed by a processor (201), cause the processor (201) to execute operations, the operations comprising:

acquire, from a plurality of temperature sensors (103) of a heatsink system (100), a plurality of first temperature values of a plurality of electronic circuit boards (107), wherein the heatsink system (100) includes:

a plurality of heatsink devices (101), wherein the plurality of heatsink devices (101) is coupled to the plurality of electronic circuit boards (107), the plurality of temperature sensors (103), wherein each temperature sensor (103) of the plurality of temperature sensors (103) is associated with a respective electronic circuit board (107) of the plurality of electronic circuit board (107), a plurality of first fans (106), wherein each first fan (106) of the plurality of first fans (106) is associated with a respective heatsink device (101) of the plurality of heatsink devices (101), and a plurality of second fans (108), wherein each second fan (108) of the plurality of second fans (108) is associated with a respective set of heatsink devices (101) of the plurality of heatsink devices (101);

determining, from the acquired plurality of first temperature values, at least one first temperature value that is greater than a first threshold temperature value;

identifying, based on the determined at least one first temperature value, at least one heatsink device (101) of the plurality of heatsink devices (110);

controlling a switching mechanism of at least one first fan (106) of the plurality of first fans (106), wherein the at least one first fan (106) is associated with the identified at least one heatsink device (110);

acquiring, from the plurality of temperature sensors (103), a plurality of second temperature values of the plurality of electronic circuit boards (107);

determining at least one effective temperature value based on the acquired plurality of second temperature values;

determining whether the determined at least one effective temperature value is greater than a second threshold temperature value;

identifying at least one set of heatsink devices (110) of the plurality of heatsink devices (101) based on the determination that the determined at least one effective temperature value is greater than the second threshold temperature value; and controlling a switching mechanism of at least one second fan (108) of the plurality of second fans (108), wherein the at least one second fan (108) is associated with the identified at least one set of heatsink devices (110).

* * * * *